(12) United States Patent
Charpin-Nicolle et al.

(10) Patent No.: US 11,005,041 B2
(45) Date of Patent: May 11, 2021

(54) METHOD FOR MANUFACTURING A RESISTIVE MEMORY

(71) Applicant: COMMISSARIAT A L'ENERGIE ATOMIQUE ET AUX ENERGIES ALTERNATIVES, Paris (FR)

(72) Inventors: Christelle Charpin-Nicolle, Fontanil-Cornillon (FR); Béatrice Biasse, Saint Martin d'Uriage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/462,058

(22) PCT Filed: Nov. 16, 2017

(86) PCT No.: PCT/FR2017/053136
§ 371 (c)(1),
(2) Date: May 17, 2019

(87) PCT Pub. No.: WO2018/091828
PCT Pub. Date: May 24, 2018

(65) Prior Publication Data
US 2019/0334085 A1    Oct. 31, 2019

(30) Foreign Application Priority Data

Nov. 18, 2016 (FR) ........................... 1661230

(51) Int. Cl.
*H01L 45/00*    (2006.01)
(52) U.S. Cl.
CPC ........ *H01L 45/165* (2013.01); *H01L 45/1233* (2013.01); *H01L 45/1246* (2013.01); *H01L 45/145* (2013.01)

(58) Field of Classification Search
CPC ............... H01L 45/165; H01L 45/1233; H01L 45/1246; H01L 45/145
See application file for complete search history.

(56) References Cited

U.S. PATENT DOCUMENTS 6,972,429 B1    12/2005 Hsueh et al.
8,872,268 B2    10/2014 Miller et al.
(Continued)

OTHER PUBLICATIONS

International Search Report as issued in International Patent Application No. PCT/FR2017/053136, dated Feb. 15, 2018.

*Primary Examiner* — Christine A Enad
(74) *Attorney, Agent, or Firm* — Pillsbury Winthrop Shaw Pittman LLP

(57) ABSTRACT

A method for manufacturing a resistive random access memory includes depositing a layer made of an active material of variable electrical resistance on a substrate containing a first electrode, forming a lower electrode; depositing an electrically conductive layer on the active material layer; etching the electrically conductive layer so as to delimit a second electrode, forming an upper electrode, facing the lower electrode; exposing at least one flank of the upper electrode to an ion beam inclined with respect to the normal to the substrate by an angle ($\alpha$) comprised between 20° and 65°, so as to implant the ions in a portion of the active material layer adjacent to the flank and located under the upper electrode, the ion implantation conditions being chosen so as to create defects in the structure of the active material and to obtain an average implantation width comprised between 5 nm and 10 nm.

10 Claims, 3 Drawing Sheets

Fig. 4C

(56) References Cited

U.S. PATENT DOCUMENTS

| | | |
|---|---|---|
| 2010/0243983 A1 | 9/2010 | Chiang et al. |
| 2014/0252295 A1* | 9/2014 | Liao .................... H01L 27/2463 257/2 |
| 2015/0041750 A1* | 2/2015 | Cai ...................... H01L 27/2463 257/4 |
| 2018/0130668 A1* | 5/2018 | Liu ................... H01L 21/31116 |

* cited by examiner

METHOD FOR MANUFACTURING A RESISTIVE MEMORY

CROSS REFERENCE TO RELATED APPLICATIONS

This application is the U.S. National Stage of PCT/FR2017/053136, filed Nov. 16, 2017, which in turn claims priority to French Patent Application No. 1661230 filed Nov. 18, 2016, the entire contents of all applications are incorporated herein by reference in their entireties.

TECHNICAL FIELD

The present invention is relative to the field of Resistive Random Access Memories (RRAMs). More specifically, the invention relates to a method for manufacturing a resistive memory.

PRIOR ART

Resistive memories, in particular Oxide-based Random Access Memories (OxRAMs), are non-volatile memories having the aim of replacing Flash type memories. In addition to high integration density, they have fast operating speeds, high endurance and good compatibility with the manufacturing methods currently used in the microelectrics industry, in particular with the Back End Of Line (BEOL) process of CMOS technology.

OxRAM resistive memories comprise a multitude of memory cells, also called memory points. Each OxRAM memory cell is comprised of a M-I-M (Metal-Insulator-Metal) capacitance comprising an active material of variable electrical resistance, in general a transition metal oxide, arranged between two metal electrodes. The oxide switches, in a reversible manner, between two resistance states, which correspond to the logic values "0" and "1" used to encode an information bit. In certain cases, more than two resistance states may be generated, which makes it possible to store several information bits in a same memory cell.

Information is written in the memory cell by switching the oxide from a high resistance state (HRS), also called "OFF" state, to a low resistance state (LRS) or "ON" state. Conversely, to erase information from the memory cell, the oxide is switched from the "LRS" state to the "HRS" state. The operation of writing an OxRAM resistive memory cell is called "SET" whereas the erasing operation is called "RESET".

The change in resistance of the oxide is governed by the formation and the rupture of a conductive filament of nanometric section between the two electrodes. Based on current knowledge, this filament seems to be due to the accumulation of oxygen vacancies (at least for the family of transition metal-based oxides) which may be accompanied by a movement of metal ions.

A drawback of OxRAM resistive memories is the great variability of the electrical resistance of a memory cell in the "OFF" state during writing and erasing cycles. For example, the resistance in the "OFF" state between several successive erasing operations can vary by more than an order of magnitude. Although less marked, the phenomenon is also observable for the "ON" state. This variability is observed not only during the course of endurance cycles on a same cell, but also from cell to cell.

This problem of variability of the electrical resistance is today a real brake to industrialisation, because it induces a reduction in the programming window (difference in resistance between the "HRS"/"OFF" and "LRS"/"ON" states) and consequently a risk of losing the information stored in the memory cell. This worry remains despite numerous efforts made in the fields of manufacturing and programming OxRAM resistive memories.

FIG. 1A schematically represents an OxRAM memory cell 10 according to the prior art. This cell 10 comprises a metal oxide layer 100 arranged between a first electrode 110 and a second electrode 120. A continuous conductive filament 130 between the electrodes 110-120 is formed through the oxide layer 100 during the writing of the memory cell.

According to several studies, one solution for reducing the variability of the electrical performances would consist in reducing the dimensions of the memory cell. In particular, the document [Conductive Filament Control in Highly Scalable Unipolar Resistive Switching Devices for Low-Power and High-density Next Generation Memory, Ryoo Kyung-Chang et al., IEDM 2013] has shown that a reduction in the contact surface between one of the electrodes 110-120 and the oxide layer 100 would make it possible to localise the formation (and the rupture) of the conductive filament 130 and to reduce problems of dispersion of the cells.

FIG. 1B shows the OxRAM memory cell 10' proposed by Ryoo et al. in the aforementioned article. An electrically insulating pad 140 occupies a central part of the oxide layer 100 in contact with the second electrode 120, which has the effect of limiting the contact surface between the second electrode 120 and the oxide layer 100 to a zone 150 located at the periphery of the insulating pad 140. With such a cell configuration, it appears that the conductive filament 130 is directed to the peripheral zone 150, and consequently confined to an edge of the cell.

The method for manufacturing this memory cell 10' is however complex to execute. Indeed, it resorts to numerous steps of lithography, deposition and planarization. Generally speaking, to reduce the contact surface, advanced lithography techniques, such as electron beam (e-beam) lithography, are necessary. Yet these techniques are cumbersome and costly to execute. Besides, it is difficult to make the electrical contact on the second electrode 120, of small dimensions. The constraints for the industrialisation of such a manufacturing method are thus numerous.

The U.S. Pat. No. 8,872,268 (Miller et al.) describes another technique for localising the formation of the conductive filament in the metal oxide layer 100 of an OxRAM memory cell. A mask 200 comprising several recesses 210 is formed on the oxide layer 100, in order to delimit in the oxide layer protected zones and exposed zones. Then, the metal oxide layer 100 covered with the mask 200 is subjected to an ion implantation 220. The ions are implanted uniquely in the exposed zones of the oxide layer 100, thereby forming several localised defect paths 230 in these same zones. The defects may be metal or oxygen atoms in interstitial position, metal atoms in substitutional position or oxygen vacancies. During the later operation of the memory cell, the conductive filament follows one of the localised defect paths formed in the oxide layer 100.

By producing preferential conductive paths for the conductive filament in this way, the changes in resistance caused during SET and RESET operations may be obtained with lower voltages. Such a localisation of the conductive filament also has the effect of increasing the ratio of the currents between the "ON" state and the "OFF" state.

The formation of the mask 200, the ion implantation 220 and the removal of the mask 200 before the deposition of the upper electrode constitute however additional steps with respect to the conventional method for manufacturing OxRAMs. Besides, in order to confine the filament within a restricted zone, the mask 200 must have good resolution characteristics, which necessitates once again resorting to advanced lithography techniques. The solution proposed by the U.S. Pat. No. 8,872,268 thus does not make it possible to improve the performances of the cell at lower cost.

SUMMARY OF THE INVENTION

It therefore exists a need to provide a method for manufacturing a resistive memory that is simple, economical and enabling the formation of the conductive filament to be confined to only a portion of the layer made of active material of variable electrical resistance, with the aim of improving the performances of the memory.

According to the invention, this need tends to be satisfied by providing a manufacturing method comprising the following steps:
- depositing a layer made of an active material of variable electrical resistance on a substrate containing a first electrode, called lower electrode;
- depositing an electrically conductive layer on the active material layer;
- etching the electrically conductive layer so as to delimit a second electrode, called upper electrode, facing the lower electrode;
- exposing at least one flank of the upper electrode to an ion beam inclined with respect to the normal to the substrate by an angle comprised between 20° and 65°, so as to implant the ions in a portion of the active material layer adjacent to said flank and located under the upper electrode, the ion implantation conditions being chosen so as to create defects in the structure of the active material.

The exposure of the flank(s) of the upper electrode to an inclined ion beam enables the formation of defects to be limited to a portion of the active material layer located in the immediate proximity of the exposed flank. Indeed, the remainder of the active material layer is protected by the upper electrode which, by shading effect, forms an obstacle to the implantation of the ions.

Unlike the method of the prior art, the manufacturing method according to the invention does not require any photolithography step with strict specifications in terms of dimensions for delimiting the zone of defects in the active material layer. Besides, the only additional step with respect to the conventional method for manufacturing resistive memories is the step of ion implantation. The manufacturing cost of a resistive memory with the method of the invention is thus lower than with the methods of the prior art. Finally, ion implantation is a widely practiced and perfectly mastered technique in the microelectrics industry, notably for the doping of semiconductor materials. It thus does not pose any difficulty for the execution of the manufacturing method according to the invention at the industrial scale.

The angle of inclination with respect to the normal of the beam of implanted ions is, in this resistive memory manufacturing method, much greater than that normally encountered in the microelectrics industry. Indeed, for the doping of semiconductor layers, the ion beam is generally inclined by several degrees (in general 7°) to avoid channeling effects in the crystalline materials. Here, this angle would not make it possible to define a zone of defects sufficiently large for the formation of the filament.

Preferably, the ion beam is inclined with respect to the normal to the substrate by an angle comprised between 40° and 50°.

In a preferential embodiment of the method, the active material layer serves as stop layer during the etching of the electrically conductive layer. Thus, only the electrically conductive layer is etched and the lower electrode is protected, at least partially, from the ion implantation by the active material layer.

Advantageously, the ions are implanted with an energy such that the average penetration depth of the ions is located within the active material layer.

Advantageously, the manufacturing method further comprises a step of depositing a protective material on the electrically conductive layer before the step of etching the electrically conductive layer (to delimit the upper electrode). This protective material prevents the ion implantation from damaging the upper face of the second electrode and does not diminish its electrical performances.

The method according to the invention may also have one or more of the characteristics below, considered individually or according to all technically possible combinations thereof:
- the ions are implanted at a dose comprised between $10^{13}$ atoms·cm$^{-2}$ and $10^{16}$ atoms·cm$^{-2}$;
- the implanted ions are metal ions, oxygen ions, halogen ions, silicon ions or argon ions;
- the electrically conductive layer is etched so as to delimit at least two upper electrodes and the angle of inclination $\alpha$ of the ion beam is chosen such that:

$$\tan\alpha \leq \frac{S}{h}$$

S being the minimum distance separating two electrodes and h being the thickness of the electrically conductive layer; and
- the active material is a transition metal oxide.

BRIEF DESCRIPTION OF THE FIGURES

Other characteristics and advantages of the invention will become clear from the description that is given thereof below, for indicative purposes and in no way limiting, with reference to the appended figures, among which.

For greater clarity, identical or similar elements are marked by identical reference signs in all of the figures.

DETAILED DESCRIPTION OF AT LEAST ONE EMBODIMENT

Figure 1A:
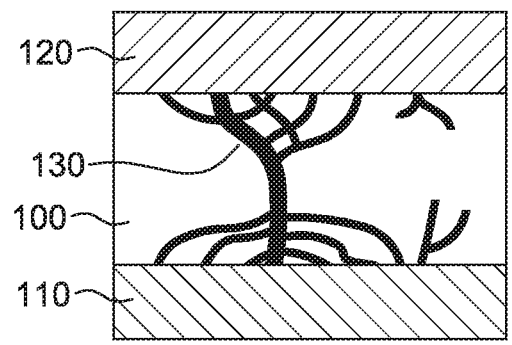
FIGS. 1A and 1B, described previously, represent two types of OxRAM resistive memory cell according to the prior art.
Figure 1B:
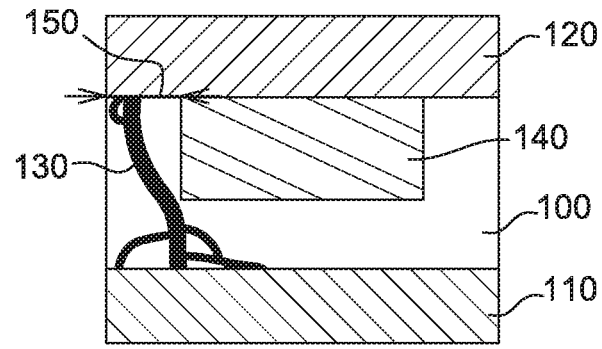
Figure 2:
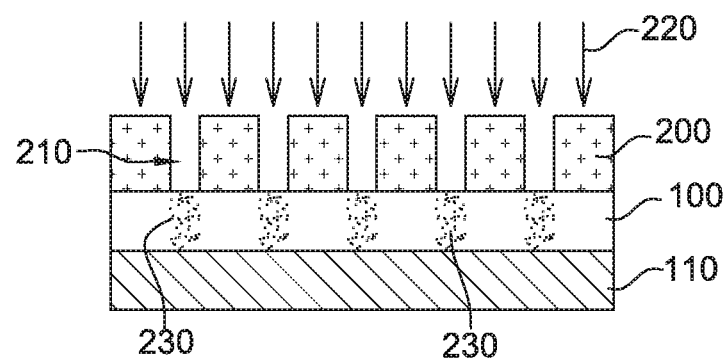
FIG. 2, described previously, illustrates the ion implantation step of a method for manufacturing an OxRAM memory according to the prior art.
Figure 3:
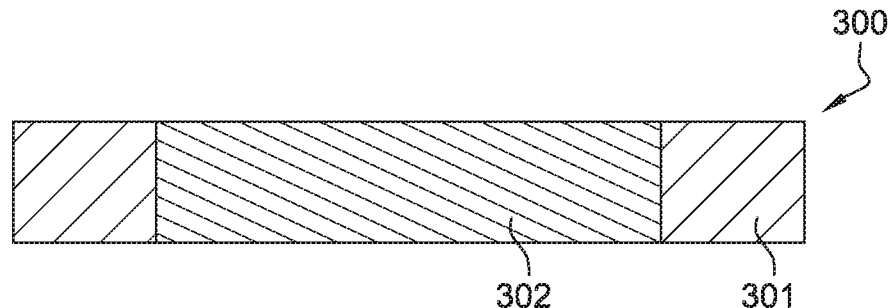
FIG. 3 represents in transversal section a substrate serving as starting point for the method for manufacturing a resistive memory according to the invention.
Figure 4A:
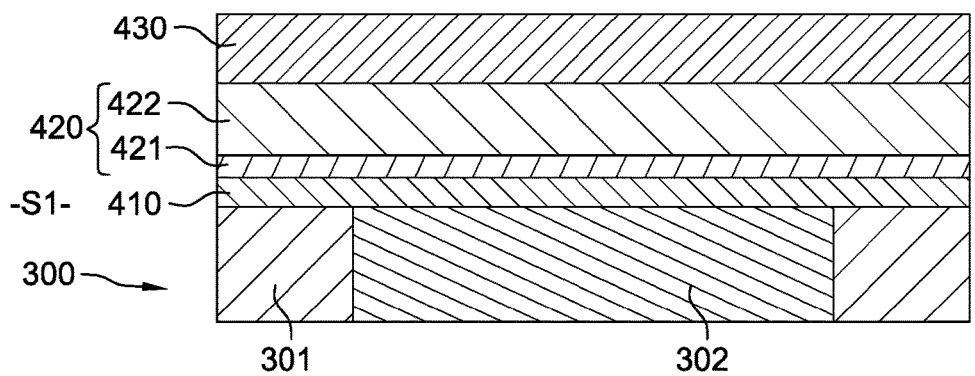
FIGS. 4A to 4C schematically represent the steps S1 to S3 of a method for manufacturing a resistive memory, according to a preferential embodiment of the invention.
Figure 4B:
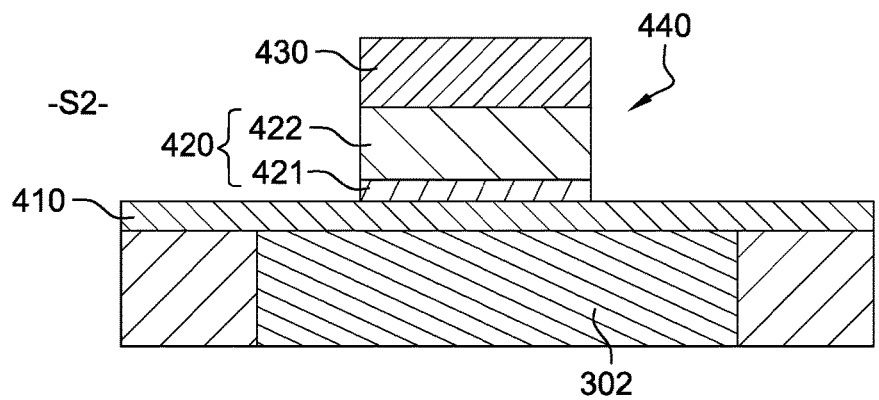
Figure 4C:
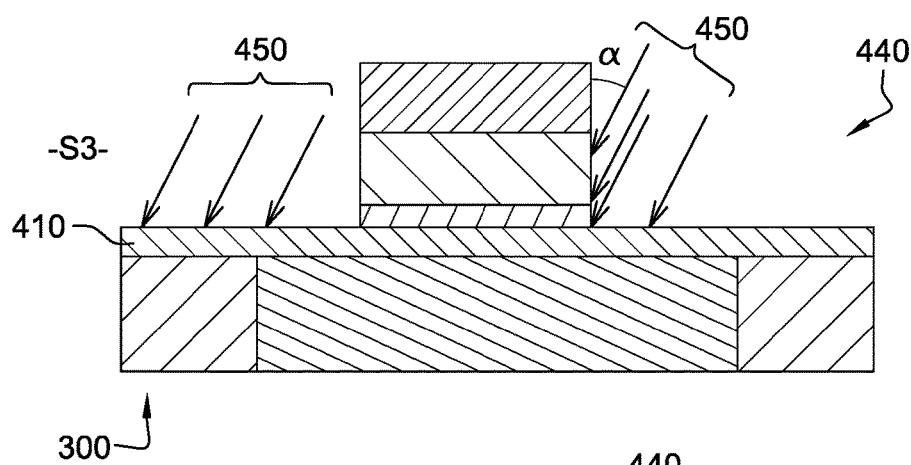

A preferential embodiment of the method for manufacturing a resistive memory according to the invention is described below with reference to FIGS. 3, 4A to 4C and 5. FIG. 3 shows a substrate 300 being able to serve as starting point for the manufacturing method. FIGS. 4A to 4C represent the different steps S1 to S3 of the manufacturing method. Finally, FIG. 5 illustrates the resistive memory obtained at the end of the manufacturing method of FIGS. 4A to 4C.

The resistive memory may comprise a multitude of identical memory cells, for example organised in lines and in columns. Each memory cell comprised a first electrode called lower electrode, a second electrode called upper electrode and an oxide layer arranged between the first and second electrodes. The oxide layer may be common to several memory cells, like one or the other of the lower and upper electrodes. For example, in a matrix of cross-point memory cells, the memory cells of a same row share the same lower electrode (formed by the bit line) and the memory cells of a same column share the same electrode (formed by the word line).

The substrate 300 advantageously comprises a CMOS circuit capable of addressing each memory cell and/or reading the datum recorded in the memory cell, that is the electrical resistance value of the cell. This circuit comprises for example transistors electrically connected to the memory cells by one or more interconnection levels. In FIG. 3 is represented in transversal section uniquely the final interconnection level before the memory cells. It is formed of a dielectric material layer 301 (for example made of $SiO_2$ or SiN) traversed by the interconnection patterns 302, preferably made of metal (copper, aluminium, metal alloys, etc.) or made of titanium nitride. These interconnection patterns 302 are for example conductive vias or conductive lines and enable the memory cells to be electrically connected to the underlying CMOS circuit.

Figure 5:
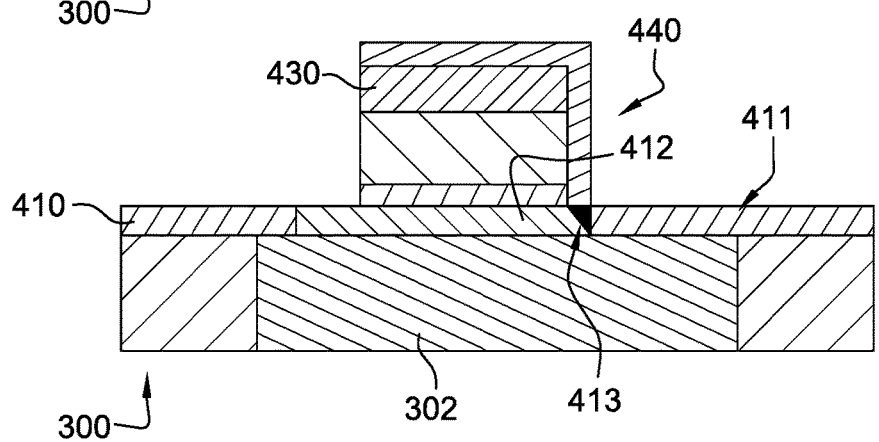
FIG. 5 is a transversal sectional view of the resistive memory cell at the end of the manufacturing method of FIGS. 4A to 4C.

For reasons of clarity, the resistive memory represented at various stages of its manufacture in FIGS. 3 to 5 only comprises a single memory cell. Consequently, the substrate 300 of FIG. 3 only has a single interconnection pattern 302.

In this preferential embodiment, the interconnection pattern 302 of the substrate 300 constitutes the lower electrode of the memory cell. Alternatively, a metal pad (surrounded by another dielectric layer) may be formed on the interconnection pattern 302 and constitute the lower electrode of the cell.

At step S1 of FIG. 4A, the substrate 300 is successively covered with a layer 410 made of an active material of variable electrical resistance and an electrically conductive layer 420 intended to form the upper electrode of the memory cell. The material of variable electrical resistance of the layer 410 is a dielectric material which can switch from a high resistance state (HRS) to a low resistance state (LRS).

The resistive memory manufactured may be of OxRAM (Oxide-based Random Access Memory), CBRAM (Conductive Bridge Random Access Memory) or HRAM (Hybrid Random Access Memory) type, depending on the nature of the active material used and the upper electrode.

Preferably, the active material is an oxide, and more preferentially a transition metal oxide, for example hafnium oxide ($HfO_2$), titanium oxide ($TiO_2$), tantalum oxide ($Ta_2O_5$), nickel oxide (NiO) or zinc oxide (ZnO). The memory is then of OxRAM type.

The dielectric layer 410 may also be composed of several superimposed oxide sub-layers (for example of $Al_2O_3/HfO_2$ type).

The electrically conductive layer 420 is formed of one or more superimposed conductive materials, preferably chosen from metals (platinum, titanium, tantalum, hafnium, zirconium), titanium nitride (TiN), tantalum nitride (TaN), doped polysilicon and metal silicides. In the example represented in FIG. 3, the conductive layer 420 is comprised of a stack of a titanium sub-layer 421 and a titanium nitride sub-layer 422.

The thickness of the active material layer 410 is comprised between 1 nm and 20 nm, whereas the thickness of the conductive layer 420 is comprised between 5 nm and 200 nm.

Advantageously, the conductive layer 420 is covered with a protective layer 430, for example made of $SiO_2$ or SiN. The aim of this protective layer 430 is to protect the upper face of the upper electrode during the later step of ion implantation (cf. FIG. 4C). Thus, it has a sufficient thickness to absorb the totality of the ions which will be directed to the upper face of the electrode.

FIG. 4B represents a step S2 during which the conductive layer 420 is etched to delimit the upper electrode 440 of the memory cell. The conductive layer 420 is etched in mesa shape of which the flanks are advantageously vertical. The etching technique used is preferably a highly anisotropic dry etching, such as RIE (Reactive Ion Etching).

The protective layer 430 advantageously serves as hard mask during the etching of the conductive layer 420. The hard mask is for example formed by optical or extreme UV photolithography and etching of the protective layer 430, then the conductive layer 420 is etched through this hard mask.

In the preferential embodiment of FIG. 4B, the conductive layer 420 is etched while leaving intact the underlying oxide layer 410. This may be obtained by choosing an etching chemistry that is selective with respect to the oxide used. The etching chemistry depends on the materials constituting the conductive layer 420 and the oxide layer 410. In the particular case of a conductive layer 420 made of TiN or Ti and an oxide layer 410 made of $HfO_2$, the etching chemistry used to etch the conductive layer 420 selectively with respect to the layer 410 may be $Cl_2$/HBr.

The oxide layer 410 then serves as etching stop layer. Preserving the oxide layer 410 during the etching step S2 makes it possible to protect the lower electrode 302 from the later step of ion implantation (FIG. 4C).

Conversely, in an alternative embodiment, the oxide layer 410 is etched at the same time as the conductive layer 420.

Finally, at step S3 of FIG. 4C, an ion implantation step is carried out so as to create a zone of defects localised on an edge of the memory cell, that is to say, on an edge of the lower electrode 302—oxide layer 410—upper electrode 440 stack. To do so, one of the vertical flanks of the upper electrode 440 (the right flank in the example of the figure) is exposed to an oblique ion beam 450. The ion beam 450 is inclined with respect to the perpendicular to the substrate 300 by an angle α comprised between 20° and 65°.

Due to the inclination of the beam 450, the ions arriving at the base of the flank penetrate into the oxide layer 410 and generate structural defects in this oxide layer.

The effect desired by the creation of this localised zone of defects is the confinement of the conductive filament within this same zone, during the operation of the memory cell. Indeed, as mentioned in the U.S. Pat. No. 8,872,268, the structural defects generated by the implantation of metal ions, oxygen ions, negatively charged halogen ions ($F^-$, $CL^-$, etc.), silicon ions or argon ions in the oxide layer favour the formation of the conductive filament. The defects may notably be metal, silicon or oxygen atoms in interstitial position, metal or silicon atoms in substitutional position or oxygen vacancies. In the case of metal ions, it would seem that the atoms implanted constitute a part of the conductive filament of the memory cell.

The conductive filament is formed for the first time during the process of "forming" the memory cell. The "forming" of a cell consists in a reversible breakdown of the oxide, that is to say that the oxide switches from an insulating state to a conducting state. After this breakdown of the oxide, the electrical resistance of the active material can witch from a low resistance (conductive) state (LRS) to a high resistance (insulating) state (HRS), by operations of erasing and writing. During an erasing and writing cycle, the conductive filament is broken then reconstructed. However, it does not disappear totally, nor change zone in the oxide layer located between the electrodes (it is reconstructed in the spot where it is formed initially, during "forming").

Unlike the method according to the prior art, the manufacturing method of FIGS. 4A-4C does not require any mask for the implantation step S3. All the surface of the substrate may be exposed to the ion beam 450 under oblique incidence, which greatly simplifies the manufacture of the OxRAM memory. The delimitation of the zone of defects located under the upper electrode results, as is described hereafter, uniquely from a shading effect of the upper electrode.

FIG. 5 schematically represents the state of the memory cell immediately after the ion implantation step S3.

An upper part of the protective layer 430, a lateral part of the protective layer 430 and a lateral part of the upper electrode 440, on the side of the exposure to the ion beam 450 (here on the right side), have been implanted (not all of these parts have the same thickness, because the density of the materials varies). The protective layer 430 prevents the ions from reaching the surface of the upper electrode 440, where the contact will be made. Thus, thanks to the protective layer 430, the quality of the electrical contact made on the upper electrode is not diminished by the ion implantation and the formation of structural defects in the upper electrode 440.

Besides, it is possible to distinguish two distinct zones in the oxide layer 410: a first zone 411 implanted by ions and a second zone 412, adjacent to the first zone 411, but devoid of ions. The ion-free second zone 412 is located in the shade of the upper electrode 440 with respect to the ion beam 450. Conversely, the first implanted zone 411 corresponds to the non-shaded zones of the oxide layer 410. The first zone 411 of the oxide layer extends outside of the upper electrode 440 (on the left and the right of the electrode) and comprises a portion 413 located under the edge of the upper electrode 440.

In other words, under the upper electrode, only the portion 413 of the oxide layer 410 immediately adjacent to the exposed flank of the upper electrode 440 is implanted, whereas the large majority of the oxide layer located under the upper electrode 440 is not impacted by the ion implantation.

The shape and the dimensions (width and depth) of the implanted zone 413 depend on the implantation parameters (nature of the ion, dose, angle and energy). The average width of the implanted portion 413 here designates the transversal dimension measured (on average) parallel to the plane of the substrate 300 and located in the plane of transversal section of FIG. 5. The depth of the implanted portion 413 is the dimension measured perpendicularly to the plane of the substrate 300.

Preferably, these conditions will be chosen so as to obtain an average implantation width of the same order of magnitude (or even a little more) than the assumed size of the filament, i.e. typically between 5 nm and 10 nm. Advantageously, an angle α equal to 45° will be chosen and the implantation energy will be modulated to affect the implantation width.

In this preferential embodiment (where only the conductive layer 420 is etched, not the oxide layer 410), the ion implantation energy is preferably chosen (for a given type of ions) so that the average penetration depth of the ions is located within the oxide layer 410. Thus, the ions virtually do not penetrate into the lower electrode 302 and do not risk altering its electrical behaviour.

The ion implantation dose is, for its part, advantageously comprised between $10^{13}$ atoms·cm$^{-2}$ and $10^{16}$ atoms·cm$^{-2}$. Such a dose has the effect of decreasing the forming voltage of the memory cell. For example, a dose of silicon ions implanted in a layer of HfO$_2$ comprised between $2 \cdot 10^{15}$ cm$^{-2}$ and $5 \cdot 10^{15}$ cm$^{-2}$ makes it possible to decrease the forming voltage by more than 1 V.

Figure 6:
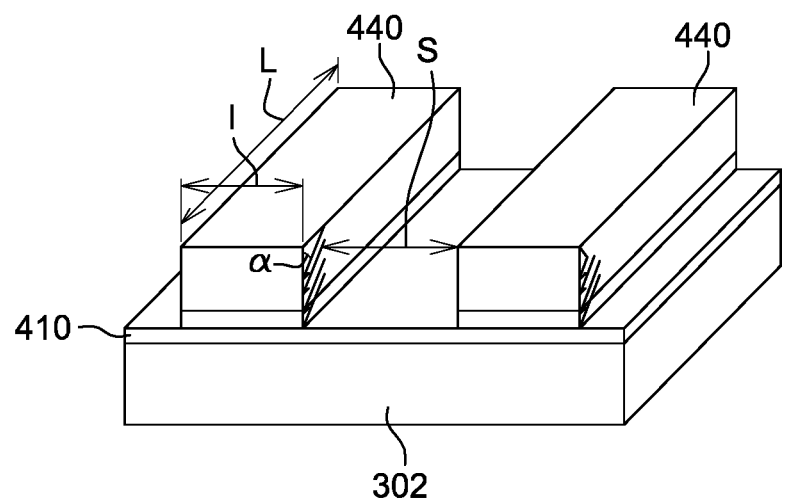
FIG. 6 illustrates two resistive memory cells spaced apart by a sufficient distance to carry out the ion implantation of FIG. 4C in each of the memory cells.

FIG. 6 is a perspective view to two adjacent memory cells formed on the substrate 300. The two memory cells advantageously share the same lower electrode 302 (formed for example by a line) and the same oxide layer 410. They each have on the other hand a mesa-shaped upper electrode 440. The different upper electrodes have preferably been formed simultaneously from a single conductive layer 420, as described previously in relation with FIG. 4B. The different memory cells or points of an OxRAM memory may thus be delimited uniquely by their upper electrode 440.

The upper electrodes 440 advantageously have a width I comprised between 80 nm and 300 nm, and a length L (in the perpendicular direction) comprised between 80 nm and 300 nm. To attain such dimensions, advanced lithography techniques, such as electron beam (e-beam) lithography, are not necessary.

The upper electrodes 440 of these two consecutive cells in the memory plane are spaced apart by a given distance S. The upper electrode of a memory cell must not form an obstacle to the ion beam directed to another memory cell. This condition on the angle of implantation a may be approximated by the following relationship:

$$\tan\alpha \leq \frac{S}{h}$$

where h is the thickness of the upper electrode and S is the separation distance between the two electrodes.

Preferably, the ion beam is inclined with respect to the exposed flank of the electrode by an angle α comprised between 40° and 50°, for example 45°. This second range, more restricted, makes it possible to obtain simultaneously localised zones of dimensions of the same order of magnitude as the thickness of the oxide layer and a high integration density of the cells of the memory.

Thus, this manufacturing method makes it possible to limit considerably the formation zone of the conductive filament in the memory cell, also called active zone, thanks to an ion implantation localised under an edge of the upper electrode. As an example, the surface area of the active zone of a memory cell having an oxide layer of 5 nm thickness and implanted according to an angle of 45° is equal to 1000 nm$^2$ (L=200 nm×I$_2$=5 nm).

As a comparison, the active zone of a memory cell with sides measuring 200 nm and in which no zone of defects is provided has a surface area of more than 40,000 nm$^2$, i.e. at least 40 times more than the implanted memory cell. To obtain the same surface area of active zone with the conventional manufacturing method, it would be necessary to delimit an upper electrode with sides measuring around 30 nm, which is complex and costly to obtain in photolithography.

The manufacturing method may also comprise, after the ion implantation step S3, a step of encapsulating the memory cell, for example with silicon nitride (SiN) or silicon dioxide (SiO$_2$), and a step of making contact on the upper face of the upper electrode, for example by means of an interconnection pad (via) or an interconnection level (line).

Since it is not necessary to reduce the dimensions of the upper electrode to obtain a small active zone, there are few constraints for making the contact on the upper electrode. The manufacturing method according to the invention thus makes easier the end of integration of the memory.

Many variants and modifications of the manufacturing method described above will become clear to those skilled in the art. In particular, at step S3 of FIG. 4C, the substrate 300 may be rotationally driven during implantation of the ions. This has the effect of exposing all the flanks of the upper electrode 440 to the inclined ion beam 450 and, consequently, to form defects at the periphery of the memory cell (rather than on a single edge of the memory cell), that is to say on all the edges of the memory cell. The implantation step S3 may thus be executed more easily. The surface area of the active zone will however be greater.

Finally, although it is not necessary to make the contact on the upper electrode, it is also possible to remove the protective layer 430 having served as etching mask after the implantation step S3.

The invention claimed is:

1. Method for manufacturing a resistive random access memory comprising:
   depositing a layer made of an active material of variable electrical resistance on a substrate containing a first electrode forming a lower electrode;
   depositing an electrically conductive layer on the active material layer;
   etching the electrically conductive layer so as to delimit a second electrode forming an upper electrode, facing the lower electrode and
   exposing at least one flank of the upper electrode and a portion of the top surface of the layer made of an active material to an on beam inclined with respect to the normal to the substrate by an angle ($\alpha$) comprised between 20° and 65°, so as to implant the ions in a portion of the active material layer adjacent to said flank and located under the upper electrode, the ion implantation conditions being chosen so as to create defects in the structure of the active material and to obtain an average implantation width comprised between 5 nm and 10 nm, wherein the ions are implanted at a dose comprised between $10^{13}$ atoms·cm$^{-2}$ and $10^{16}$ atoms·cm$^{-2}$ and the ions being metal ions, negatively charged halogen ions, or silicon ions, and wherein only one flank of the upper electrode is exposed to the ion beam so as to form a localized zone of said defects under said one flank.

2. The method according to claim 1, wherein the ion beam is inclined with respect to the normal to the substrate by an angle ($\alpha$) comprised between 40° and 50°.

3. The method according to claim 1, wherein the ions are implanted with an energy such that the average penetration depth of the ions is located within the active material layer.

4. The method according to claim 1, comprising depositing a protective material on the electrically conductive layer before the etching of the electrically conductive layer.

5. The method according to claim 1, wherein the electrically conductive layer is etched so as to delimit at least two upper electrodes and wherein the angle of inclination $\alpha$ of the ion beam is chosen such that $$\tan\alpha \le \frac{S}{h}$$

S being the minimum distance separating two electrodes and h the thickness of the electrically conductive layer.

6. The method according to claim 1, wherein the active material is a transition metal oxide.

7. The method according to claim 1, wherein the active material layer implanted with said ions is unetched.

8. Method for manufacturing a resistive random access memory comprising:
   depositing a layer made of an active material of variable electrical resistance on a substrate containing a first electrode forming a lower electrode,
   depositing an electrically conductive layer on the active material layer;
   etching the electrically conductive layer so as to delimit a second electrode forming an upper electrode, facing the lower electrode and
   after said etching, exposing at least one flank of the upper electrode and a portion of the top surface of the layer made of an active material to an ion beam inclined with respect to the normal to the substrate by an angle ($\alpha$) comprised between 20° and 65°, so as to implant the ions in a portion of the active material layer adjacent to said flank and located under the upper electrode, the ion implantation conditions being chosen so as to create defects in the structure of the active material and to obtain an average implantation width comprised between 5 nm and 10 nm, wherein the active material layer serves as stop layer during the etching of the electrically conductive layer, an etching chemistry for etching the electrically conductive layer being selective with respect to the active material layer such that the active material layer is not removed by the etching of the electrically conductive layer.

9. The method according to claim 8, wherein the ions are implanted at a dose comprised between $10^{13}$ atoms·cm$^{-2}$ and $10^{16}$ atoms·cm$^{-2}$.

10. The method according to claim 8, wherein the implanted ions are metal ions, oxygen ions, halogen ions, silicon ions or argon ions.

* * * * *

UNITED STATES PATENT AND TRADEMARK OFFICE
CERTIFICATE OF CORRECTION

PATENT NO.       : 11,005,041 B2  
APPLICATION NO.  : 16/462058  
DATED            : May 11, 2021  
INVENTOR(S)      : Christelle Charpin-Nicolle et al.

Page 1 of 1

It is certified that error appears in the above-identified patent and that said Letters Patent is hereby corrected as shown below:

In the Claims

Claim 1, Column 9, Line 46 should read:
"...material to an ion beam inclined with respect to the.."

Signed and Sealed this
Sixth Day of July, 2021

Drew Hirshfeld
*Performing the Functions and Duties of the*
*Under Secretary of Commerce for Intellectual Property and*
*Director of the United States Patent and Trademark Office*